United States Patent [19]

Simko

[11] Patent Number: 4,989,179

[45] Date of Patent: * Jan. 29, 1991

[54] HIGH DENSITY INTEGRATED CIRCUIT ANALOG SIGNAL RECORDING AND PLAYBACK SYSTEM

[75] Inventor: Richard T. Simko, Los Altos Hills, Calif.

[73] Assignee: Information Storage Devices, Inc., Santa Clara, Calif.

[*] Notice: The portion of the term of this patent subsequent to Dec. 26, 2006 has been disclaimed.

[21] Appl. No.: 420,296

[22] Filed: Oct. 12, 1989

Related U.S. Application Data

[63] Continuation of Ser. No. 218,634, Jul. 13, 1988, Pat. No. 4,890,259.

[51] Int. Cl.$^5$ .............. G11C 7/00; G11C 11/40; G11C 16/00; G11C 27/00

[52] U.S. Cl. ................................ 365/45; 365/104; 365/185

[58] Field of Search ............ 365/45, 189.01, 185, 365/189.07, 104; 360/32, 39

[56] References Cited

U.S. PATENT DOCUMENTS

| 4,211,997 | 7/1980 | Rudnick et al. | 360/32 |
| 4,318,188 | 3/1982 | Hoffmann | 360/32 X |
| 4,890,259 | 12/1989 | Simko | 365/185 X |

Primary Examiner—Alyssa H. Bowler

[57] ABSTRACT

The present invention is a high density integrated circuit analog signal recording and playback system. The recording and playback system is based upon an array storing analog signals. The array has rows and columns of non-volatile memory cells to store the signal information. Analog column read/write circuitry is used to both store the analog information and retrieve it on a real time basis, using interleaving of analog information on a plurality of sample/hold circuits prior to storage in the array to increase throughput.

12 Claims, 4 Drawing Sheets

HIGH DENSITY INTEGRATED CIRCUIT ANALOG SIGNAL RECORDING AND PLAYBACK SYSTEM

This is a continuation of application Ser. No. 07/218,634, filed July 13, 1988, now U.S. Pat. No. 4,890,259.

BACKGROUND OF THE INVENTION

1. The Field of the Invention

The field of the invention specifically relates to an apparatus for electronic storage of analog signal information.

2. Prior Art

Many devices are known in the art for the electronic storage of analog information. In a typical prior art device using digital storage techniques, the underlying information is essentially analog, such as sound, which must be stored electronically in digital form. A common analog signal to be digitally recorded is the output signal of a microphone, which is routed through an input filter to an amplifier. The amplifier supplies the signal to a sample and hold circuit. The information from the sample and hold circuit is passed through an analog-to-digital (A-to-D) converter which supplies the digital output information to memory. In order to play back the recorder sound information from the memory, the contents of the memory must first pass through a D-to-A converter to be reconverted to analog. The D-to-A converter sends its output signal through a filter to an amplifier and then to a speaker. In this essence, that is how prior art digital electronic storage of sound information is done.

Digital storage provides very good sound quality. The reproduced sound is equivalent to the input sound. The disadvantages of the prior art system are its high complexity, resulting from A-to-D and D-to-A conversions, and the large amount of memory required for digital storage of sound information. For telephone, for example 64K bits are needed to store each second of conversation.

What is needed is a device that can electronically store analog information at reasonable precision but with substantially reduced complexity and memory requirements from what is required by digital techniques. Such a system should be designed so that small errors in recording the signal information are not damaging to the reproduction quality upon playback. The system of the present invention provides an electronic signal recording and playback apparatus which is tolerant of small errors in recording and stores signal information in considerably less memory space than that required for digital storage.

SUMMARY OF THE INVENTION

The present invention uses a floating gate, non-volatile memory array for storing analog information. The invention provides the necessary unique record, playback and control circuitry used to convert the information to a form suitable for storage and to reconvert the stored information for playback. Rows and columns of the memory array store the analog information. The array comprises rows and columns of non-volatile floating gate memory cells. Each cell is capable of storing a charge within a predetermined voltage range. The write circuitry uses sample/hold circuits and analog transfer circuits for writing the analog data to memory. Analog input signals are interleaved between two or more pluralities of sample/hold circuits so that while one plurality of sample/hold circuits is receiving an input signal, the other plurality of sample/hold circuits is simultaneously placing its analog information into the memory array with the aid of an analog transfer circuit.

The write circuitry of the invention receives analog input signals and stores them on the sample and hold circuitry sequentially, interleaving sets of signals between pluralities of sample/hold circuits at a sufficient sampling rate to achieve recording of reasonable quality. Read circuitry coupled to the array retrieves the analog information stored sequentially in the array. The invention provides sufficiently fast storage and retrieval to permit real time recording. Sequencing circuitry paces the reading of the memory so that a constant stream of signal output is provided. In this manner, analog information, such as sound, may be stored with reasonable precision, i.e., telephone line quality sound, in a much smaller space than would be possible if it were stored as digital information.

With the present invention it is possible to record analog information such as sound, physical vibration, motion data or physiological signals, such as ECG signals.

DETAILED DESCRIPTION OF THE PREFERRED EMBODIMENT

The present invention relates to a high density integrated circuit analog signal recording and playback system. The system comprises a semiconductor memory array having memory cells that can store analog information, and the read, write and control circuitry for accessing it. The invention is useful where it is important to minimize the size and cost of the storage array, but where absolute precision of the information reproduction is not vital. The invention provides a solid state alternative to bulky, unreliable, electro-mechanical systems, such as tape recorders.

The present invention will be described in terms of a preferred embodiment using an analogy to an audio tape recorder. The invention applies generally to analog signal recording; however, a preferred embodiment of the invention provides a recording device capable of operating like a magnetic tape recorder, termed a "tape recorder on a chip", where the magnetic tape is replaced by semiconductor memory. The invention provides a totally non-mechanical system. It may not produce the precise sound quality of a fully digital recording and playback system such as digital audio tape recorders, but can provide a quality equal to that of normal telephone lines, making it ideally suited for telephone answering machines. The present invention is capable of dramatically reducing the size of the storage element required to store the audio information compared to what is required by conventional digital sound storage systems. For example, a system where 256 different analog levels can be differentiated in one cell is equivalent to the storage of 8 bits of digital information. Using digital storage recording, this would require 8 digital cells. Yet, using the invention, an analog signal containing the equivalent information of eight digital bits can be stored in the same amount of hardware as the prior art digital recording requires for a single digital bit. Thus, the storage space saving is a factor of eight.

The preferred embodiment of the present invention uses erasable, electrically programmable read-only memory cells (EEPROMs) as are well known in the art. They are normally used to store binary digital information, that is information represented as one of two different voltage states. Typically the two voltage states are zero and a positive voltage between two and five volts. Prior to this invention, very short term analog storage has been implemented in other semiconductor devices, such as charge coupled devices (CCDs). In a CCD, the charge is stored on a capacitor. However, analog information cannot be stored on a CCD for very long because the charge leakage rate on the CCD's storage capacitor is far too high to maintain any semblance of accuracy. With EEPROMs, the analog information is stored in a nonvolatile manner, typically in the floating gate of a MOSFET transistor. Unlike the capacitor of a CCD, the floating gate of an EEPROM does not leak charge.

An EEPROM is charged by subjecting its floating gate to a high voltage, typically 10 to 30 volts. There are difficulties when attempting to write and read analog information to and from and EEPROM cell. The writing must be done at high voltages which correspond to the incoming low voltage analog signal. The high voltage writing must produce a cell conductivity level which properly corresponds to the analog signal even when the cell is being read at the low reading voltages. Ideally, when cells are read at the low reading voltages, they will output a signal that exactly mimics the original low voltage incoming signal.

Figure 1:
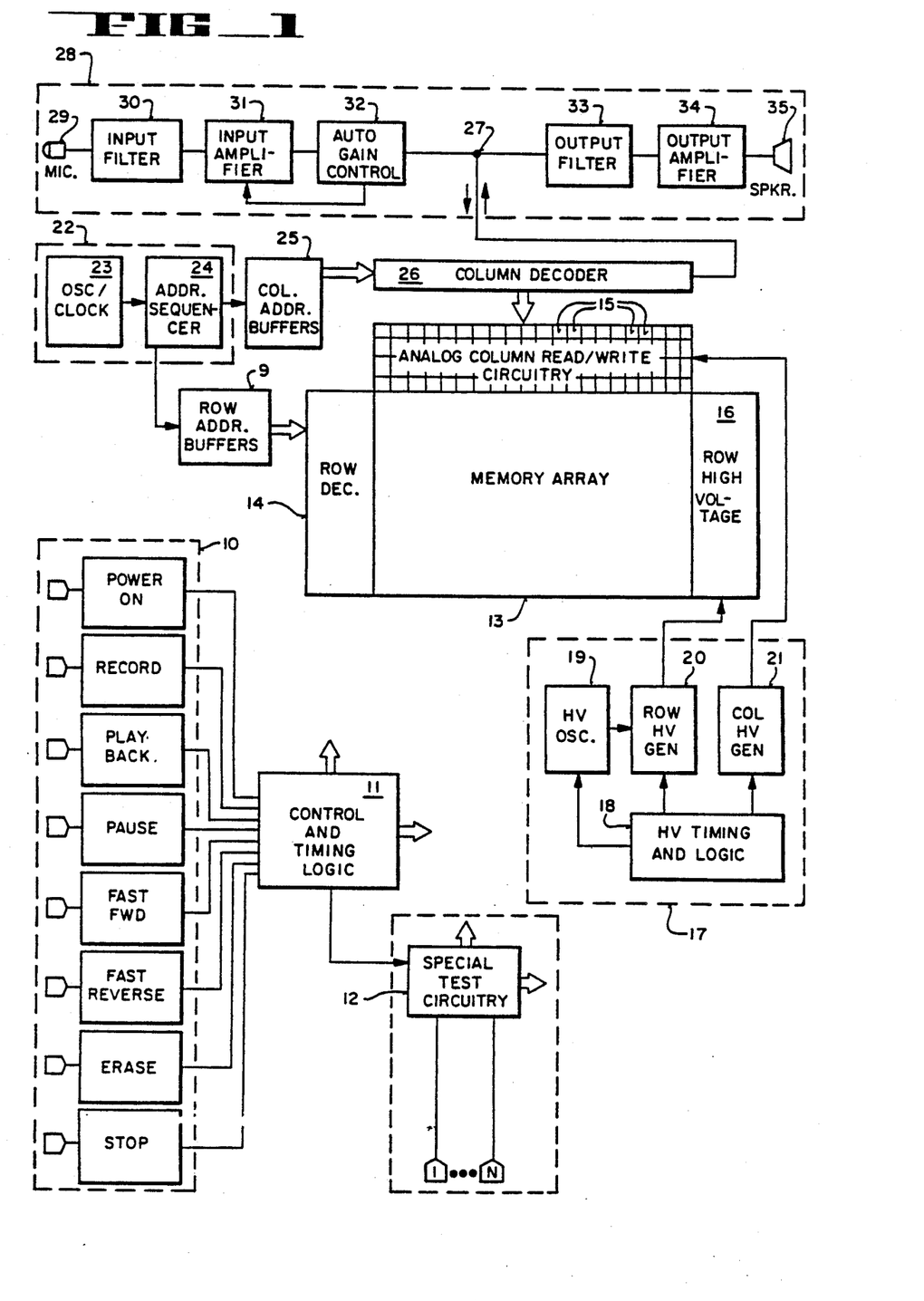
FIG. 1 is a block diagram of the sound recording and playback system of the present invention.

FIG. 1 shows the analog integrated circuit sound recording and playback system of the invention. A command input means 10 has provision for various control functions, including switches for power on, record, playback, pause, fast forward, fast reverse, erase and stop. These control functions are the same ones as those found on magnetic tape recorders. The command input means 10, coupled to control and timing logic circuitry 11, may be implemented as a microprocessor compatible serial interface. Control and timing ciruicitry 11 coordinates the various components of the recording and playback system and is also coupled to test circuitry 12. Test circuitry 12 is not an essential component of the system, but such circuitry is common for evaluation and testing to detect errors in the control and timing logic circuitry, to avoid the faulty components and to speed up testing of the memory array.

Central to the system is memory array 13. Memory array 13 has rows and columns of non-volatile memory cells, preferble EEPROMS cells. Bordering memory array 13 is a row decoder 14 and analog read/write circuitry 15 used to control the column drivers. The memory array 13 uses page mode addressing where row decoder 14 activates a particular row and the read/write column drivers 15 sequentially access the individual cells of the activated row.

Memory array 13 also is adjacent to row high voltage circuitry 16, which is used to provide high voltage levels to an activated row for recording or writing. On the chip is a high voltage generator circuit 17 for generating the recording voltages. Generator 17 includes high voltage timing and logic circuit 18 coupled to high voltage oscillator 19, row high voltage generator 20 and column high voltage generator 21 for providing timing signals used for recording. High voltage oscillator 19 is coupled to row high voltage generator 20 and to column high voltage generator 21 to provide timing for the row and column generators. Row high voltages generator 20 is coupled to row high voltage circuitry 16. Column high voltage generator 21 is coupled to read/write column drivers 15.

The system of the invention is synchronous, time by a clock addressing sequencer 22. Clock addressing sequencer 22 is comprised of a combined clock and oscillator 23 and an addressing sequencer 24. These provide for timed generation of addresses from sequencer 24. The timed generation of addresses combines with page mode addressing enables the system to store analog information in real time. Address sequencer 24 is coupled to column address buffers 25 and to row address buffers 9. These buffers are intermediaries between address sequencer 24 and the row and column decoders 14 and 15, respectively. Row address buffers 9 provide the row addresses to the row decoder 14. Column address buffers 25 provide, through column decoder 26, the addresses of read/write column drivers 15 that are to be accessed. Column decoder 26 is coupled to read/write column drivers 15.

Column decoder 26 is also coupled to node 27 of I/O interface device 28. I/O interface device 28 comprises a microphone 29, an input filter 30, an input amplifier 31, an automatic gain control 32, an output filter 33, an output amplifier 34, and a speaker 35. Microphone 29 and speaker 35 (or other analog input signal transducer and output transducer) are external to the semiconductor chip. Input and output filters 30 and 33 may preferably be of a digital design using an on-board active filter oscillator as is well known in the art.

In a prior art digital recording system, node 27 contains an additional analog-to-digital converter for input and a second digtial-to-analog converter for output. The present invention eliminates the need for these converters. Microphone 29 is coupled directly to input filter 30. Input filter 30 is coupled to input amplifier 31 which may be coupled to an automatic gain control 32, if desired, which in turn is coupled back to input amplifier 31 to provide feedback. AGC 32 is coupled to node 27 where it can send the analog input signal to column decoder 26. Node 27 is also coupled to output filter 33 which is in turn coupled to output amplifier 34 that is coupled to speaker 35. Thus I/O interface device 28 provides a mechanism for translating an analog input signal from a transducer to a signal capable of being directly stored on a memory cell without A-to-D conversion, as well as for translating stored analog information to a form appropriate for driving an output transducer without D-to-A conversion. For sound information, the input and output transducers would be a microphone and a speaker.

Figure 2:
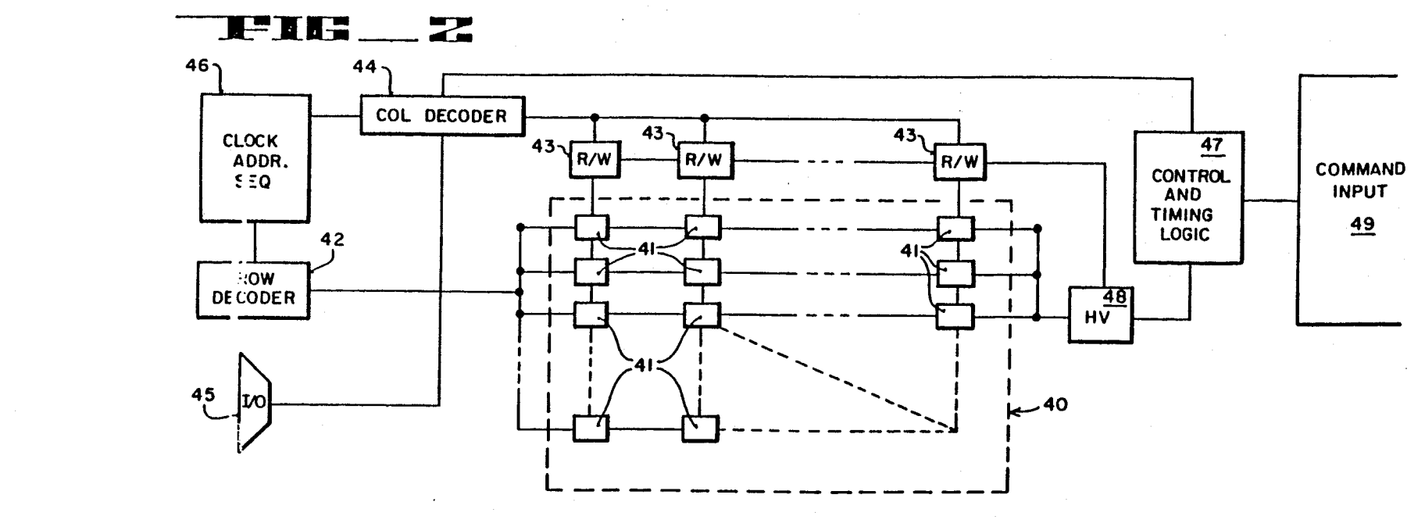
FIG. 2 is a block diagram of the storage array of the present invention.

FIG. 2 shows a block diagram of the EEPROM array of the present invention. The memory array 40 is comprised of rows and columns of EEPROM memory cells 41. The cells of each row of array 40 are coupled together as shown. Each row is coupled to row decoder 42. The cells of each column of array 40 are also coupled together as shown, and each column is also coupled to an individual read/write driver 43. All read/write column drivers 43 are in turn coupled to column decoder 44. Column decoder 44 is coupled to I/O device 45. A shift register can be used for column decoder 44 in many applicaitons of the present invention because a shift register occupies a small area of the integrated circuit.

I/O device 45 is a representation of both an input circuit and an output circuit. As described earlier, the input circuit can include such devices as a microphone, an input filter, and an amplifier. The output circuit can contain such devices as a filter, an amplifier, and a speaker. These input and output devices are all well known in the art.

Still referring to FIG. 2, a clock address sequencer 46 is coupled both to column decoder 44 and to row decoder 42. Clock address sequencer 46 properly times the input and output signals to and from the memory array 40.

Control and timing logic 47 is coupled to column decoder 44, high voltage circuit 48, and command input means 49. Control and timing logic 47 has circuitry to coordinate the storage and retrieval of analog information from the memory array 40. High voltage circuit 48 is used to supply the row voltages necessary in transferring the analog input into the memory 40. Command input means 49 is the user interface between the circuitry of the present invention and the human user.

The various functions of a typical audio tape recorder can be analogized to various circuit functions of the invention. For example, the power-on switch of a common tape recorder can be thought of as the chip enable in the present invention. Similarly the record switch is analogous to a write enable. The playback switch is an output enable with the fast forward and rewind buttons indicating a speeding up of addressing in the forward and backward directions.

Figure 3:
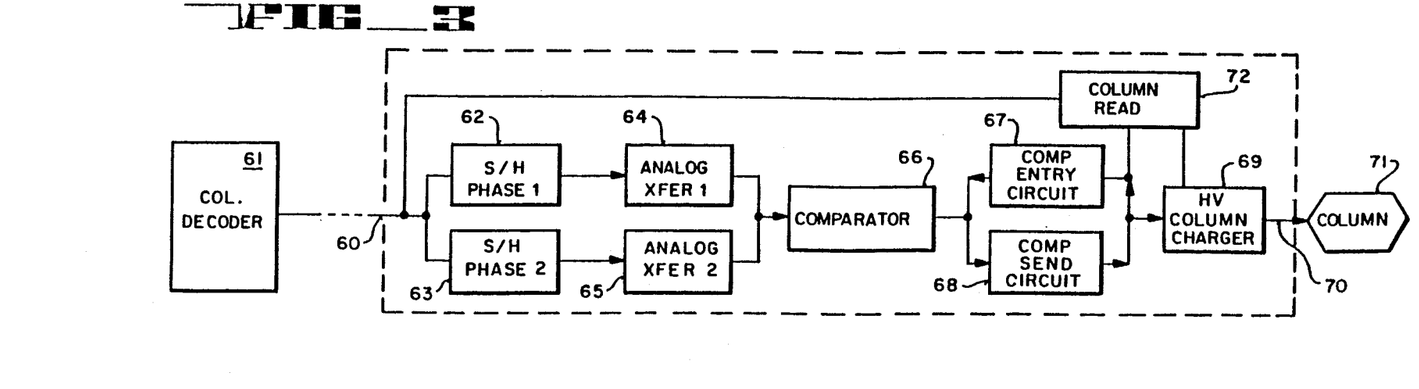
FIG. 3 is a block diagram of the analog column read/write circuitry of the present invention.

FIG. 3 shows in more detail one of the read/write column drivers of the present invention. In actual practice, there are many such column drivers, one for each column. For an 8 KHz sample rate, 320 such column driver may be employed. The actual number is not preordained, but may be chosen by the practitioner depending on signal quality desired. Input line 60 from column decoder 61 is coupled to sample/hold phase-1 circuit 62 and to sample/hold phase-2 circuit 63. Sample/hold phase-1 circuit 62 is in turn coupled to analog transfer-1 circuit 64. Sample/hold phase-2 circuit 63 is coupled to analog transfer-2 circuit 65. Both analog transfer-1 circuit 64 and analog transfer-2 circuit 65 are coupled to comparator 66. Comparator 66 is coupled to both comparator entry circuit 67 and to comparator send circuit 68. Both comparator entry circuit 67 and comparator send circuit 68 are coupled to high voltage column charger 69. High voltage charger 69 is coupled to an output line 70 which in turn is coupled to column 71. Column read gate 72 is coupled to input line 60 and to high voltage column charger 69.

The basic operation of the array of the invention is described below. Referring to FIG. 2, the array is powered on and the record command is given by command input means 49. This powers on most of the circuitry except the output circuits of I/O interface device 45. This also starts the clock address sequencer 46. A first row and column are selected in the memory array and the analog information representing sound patterns is processed through the input circuitry of I/O interface device 45. The analog signal is directed to column decoder 44 and on to one of read/write column drivers 43. The analog signal is sampled and held in the read/write column driver 43.

Referring now to FIG. 3, the sample and hold function in the column drivers employs either sample/hold phase-1 circuit 62 or sample/hold phase-2 circuit 63. The actual passing of signals of the two sample/hold circuits is interleaved. For example, sample/hold phase-1 circuit 62 may be the first sample/hold circuit to receive an analog input signal, starting a first phase of storage of a series of input signals. This first phase proceeds until all sample/hold phase-1 circuits 62 are completely full of information. At this point, a second phase begins where the input data from the input line 60 is sampled and held by the sample/hold phase-2 circuits 63. While sample/hold phase-2 circuits 63 are receiving the analog input signals from input line 60, the information from sample/hold phase-1 circuits 62 are being written into columns 71.

The two phase interleaving approach is necessary for practical considerations. With a sample rate of 8 kilohertz for real time sound recording, the recording would require that each successive cell would have to be written to in 125 microseconds. As a practical matter, a much longer time is required for the high voltage pulse to sequence through 400 increments. For example, at 100 microseconds per increment, 40 milliseconds would be required to write an analog level into a group of cells. The preceding example was based on the assumption that the increments were spread over a 5 to 20 volt range. However, differing cells might have different analog writing response ranges. For example, some cells may have a response range between 7 and 15 volts. Adjusting between this reduced range and the full 5 to 20 volt range is referred to in the art as scaling. In addition, memory cells age after many writing due to electron trapping, a phenomenon well known in the art of floating gate EEPROM devices. As a result of this electron trapping, the values may in fact shift over time, for example for 7-15 volts to 8-16 volts. Because of these practical considerations, a reasonable choice for the number of increments for the 5 to 20 volt range is about 400. With 400 increments it is possible to be certain of approximately a 200 increment resolution in the recording of information for cells that had a response range of, for example, 7 to 15 volts.

It is clear that at an 8 KHz sample rate which is applied for 40 milliseconds, where 320 samples are taken, a minimum of 320 columns must be written to in order to record that duration of sound. To accomodate these timing practicalities, one set of sample and hold circuits must be recording real time for about 40 milliseconds while simultaneously a second set of sample and hold circuits already containing information is writing into the 320 columns. Thus a two phase sample and hold system, where each phase either receives samples over 40 milliseconds or is used to record samples over 40 milliseconds, is practical and desired. This technique is referred to as interleaving.

Figure 4:
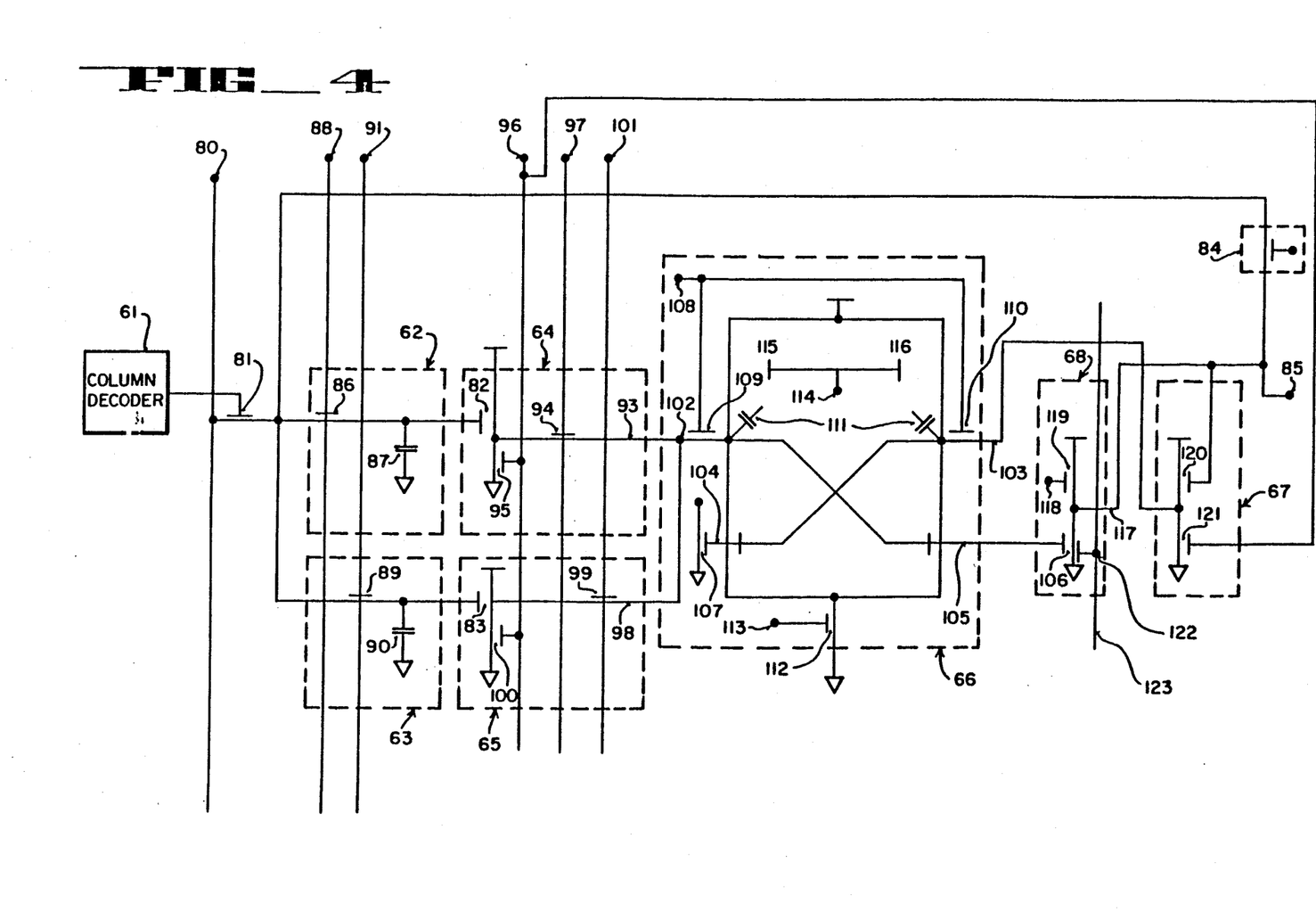
FIG. 4 is a schematic circuit diagram of part of the circuitry of FIG. 3.

FIG. 4 is a schematic circuit diagram of most of the circuitry of FIG. 3. Where possible, the same numbers are used in both Figures. A common I/O analog line 80 is used to transfer analog signals to and from the memory array. Column decoder 61 controls the transfer of analog signals from analog I/O line 80 through transfer transistor 81. Analog I/O line 80 is coupled, via column access gate 81, to column transfer transistors 82 and 83, sample/hold phase-1 circuits 62, and sample/hold phase-2 circuits 63. The timing of column access gate 81 is important because during the input cycle, the voltage on analog I/O line 80 is generally changing. Transistor 81 must conduct during the input cycle for its respective column and be non-conducting when signal sampling is completed. This can be accomplished be a clock signal that synchronizes column decoder 61 during the write cycle. In the preferred embodiment, the clock signal runs at a rage of 8 KHz.

Column read gate 84 controls the coupling between analog I/O line 80 and $V_{I/O}$ line 85. When column access transistor 81 and column read transistor 84 are rendered conductive, the analog signal from $V_{I/O}$ line 85 can be sent directly to analog I/O line 80.

Sample/hold phase-1 circuit 62 comprises gate 86 and capacitor 87. Transistor 86 is coupled to phase-1 sample/hold line 88. During the first phase, transistor 86 is rendered conductive by phase-1 sample/hold line 88, thus allowing a signal from analog I/O line 80 to charge capacitor 87. Capacitor 87 stores an analog signal.

Similarly sample/hold phase-2 circuit 63 comprises transistor 89 and a capacitor 90. Transistor 89 is coupled to phase-2 sample/hold line 91. During the second phase, transistor 89 is activated by phase-2 sample/hold line 91, thus allowing a signal from I/O analog line 80 to charge capacitor 90. Capacitor 90 stores analog signal. Sample/hold circuits 62 and 63 respectively, are coupled to transistors 82 and 83 of analog transfer circuits 64 and 65, respectively.

Analog transfer-1 circuit 64 is comprised of a line 93 and transistors 82 and 94 and 95. The gate of transistor 82 is coupled to sample/hold circuit 62, and is used to present an image of the voltage stored on capacitor 87 to comparator 66. The gate of transistor 94 is coupled to transfer-1 line 97. Transistor 95 has its drain coupled to line 93 between transistor 82 and comparator 66 such that only when transfer-1 line 97 is activated does the image of the voltage on capacitor 87 appear on line 93 as an input to comparator 66. The gate of transistor 95 is coupled to clean-up switch line 96 and its drain terminal connected to line 93 through transfer transistor 94. When clean-up switch line 96 is activated, line 93 is set to a level near ground.

Similarly, analog transfer-2 circuit 65 is comprised of a line 98 and transistors 83, 99, and 100. The gate of transistor 83 is coupled to sample/hold phase-2 circuit 63, and is used to present an image of the voltage stored on capacitor 90 of sample/hold phase-2 circuit 63 to comparator 66 through transfer transistor 99. Transistor 99, having its gate coupled to transfer-2 line 101, is connected between the intersection of transistors 83 and 100 and comparator 66 such that only when transfer-2 line 101 is activated does the image of capacitor 90 of sample/hold circuit 63 appear at comparator 66. The gate of transistor 83 is coupled to clean-up switch line 96 and the source-drain circuit is connected such that when clean-up switch line 96 is activated, line 98 is set to a voltage level near ground.

The transfer of stored signals from a sample/hold circuit 62 or 63 to the storage cells is accomplished by an analog transfer device, such as analog transfer device, such as analog transfer devices 64 and 65. Referring to FIG. 1, the clock addressing sequencer 22 continues to pass the series of analog signals to be stored, one at a time, to one sample/hold circuit and corresponding column and then to the next at a predetermined sampling rate. For telephone quality sound, an 8 KHz rate is used. As the sequencing continues, all of the columns will have been addressed for a particular row. The sequencer then continues the recording by smoothly selecting the next row and returning to the first column, followed by sequencing through the columns. During the recording, the various read/write column drivers 15 are actively charging a memory cell in its corresponding column with a stored signal corresponding to a value in a sample/hold phase-1 circuit, as well as receiving a new signal corresponding to a value in a sample/hold phase-2 circuit. When one phase fills up, the roles switch.

For example recording one second of speech at a sample rate of 8 kilohertz requires 8,000 analog sample signals each stored in one cell. In order to record one minute of sound, this number multiplied by 60, requiring 480,000 cells. Assuming each cell contains an analog signal which can be differentiated between approximately 256 possible levels, each analog signal stored in a cell of the present invention carries information that otherwise would require eight digital memory cells to be stored digitally. Therefore to store one minute of sound information digitally requires 8 times the number of memory cells required by the present invention.

Comparator 66 has two input line 102 and 103, as well as two output lines 105 and 104 coupled respectively to comparator output transistor 106 and matching transistor 107. Comparator 66 is symmetrical, with input line 102 on one side receiving the analog input signal from analog I/O line 80 and input line 103 on the other side coupled to receive an image of the signal present on $V_{I/O}$ line 85. Comparator output transistor 106 and matching transistor 107 are matched such that they have the same capacitance, even though only comparator output transistor 106 is actually used, with matching transistor 107 being a dummy transistor used only to mimic the capacitance of comparator output transistor 106.

Comparator 66 commences operation by a signal from comparator isolation line 108. Comparator isolation line 108 is used to control input lines 102 and 103 through transistors 109 and 110, respectively. When the comparator signal on line 108 is activated, the signals on input lines 102 and 103 charge comparator capacitors 111. Comparator capacitors 111 represent the node capacitance of the nodes where input lines 102 and 103 enter comparator 66. Transistor 112 is coupled between the common node of comparator 66 and ground, as is known in the art. Terminal 113 connected to the gate of transistor 112 carries a signal that starts the first stage of amplification of the signal difference across comparator 66. Second stage amplifier terminal 114 is coupled to MOS transistors 115 and 116. The second stage amplification signal at transistor 114 renders transistors 115 and 116 conductive to complete the amplification of the signal difference across the comparator 66. Comparator 66 provides the necessary amplification and resolution for differentiating between hundreds of graduations of voltage levels, for example over an input voltage range of approximately 1 to 3 volts.

Comparator send circuit 68 is coupled to an output line 117 of comparator 66 and to $V_{I/O}$ line 85. Comparator 66 produces a signal indicating that one input is either higher or lower than the other. Clock line 118 controls transistor 119 which is used to charge line 117 to at or near the power supply voltage. Clock line 123 controls decoupling transistor 12. When both transistors 119 and 122 are off, line 117 is free to move with the $V_{I/O}$ potential of line 85. Line 85 must be biased only by the circuitry shown in FIG. 5 during comparator set-up. If transistor 122 were absent, a voltage on the gate of transistor 106 could cause transistor 106 to become conductive and undesirably bias lines 117 and 85. Comparator output transistor 106 has its source-drain circuit between line 117 and ground. When clock line 118 is deactivated and transistor 122 is activated, line 117 is pulled down to ground if the gate of comparator output transistor 106 has a high voltage potential. If transistor 106 is off, line 117 remains at a potential near the power supply level $V_{CC}$.

Comparator entry circuit 67 comprises line 103 and transistors 120 and 121. Line 103 is coupled through transistor 120 between a voltge source $V_{CC}$ and comparator 66. The gate of transistor 120 is coupled to $V_{I/O}$ line 85, and its source-drain circuit is between a voltge source $V_{CC}$ and comparator 66. Transistor 120 has the same characteristics as transistors 82 and 83 so that the voltage drop of both the sampled signal in capacitors 87 or 90 and the trial signal from $V_{I/O}$ line 85 are approximately equal. Transistor 121 has its gate coupled to clean-up switch line 96 and has its source-drain circuit between line 103 and ground. Transistor 121 provides for setting comparator line 103 to a voltage level at or near ground when clean-up switch line 96 is activated.

Figure 5:
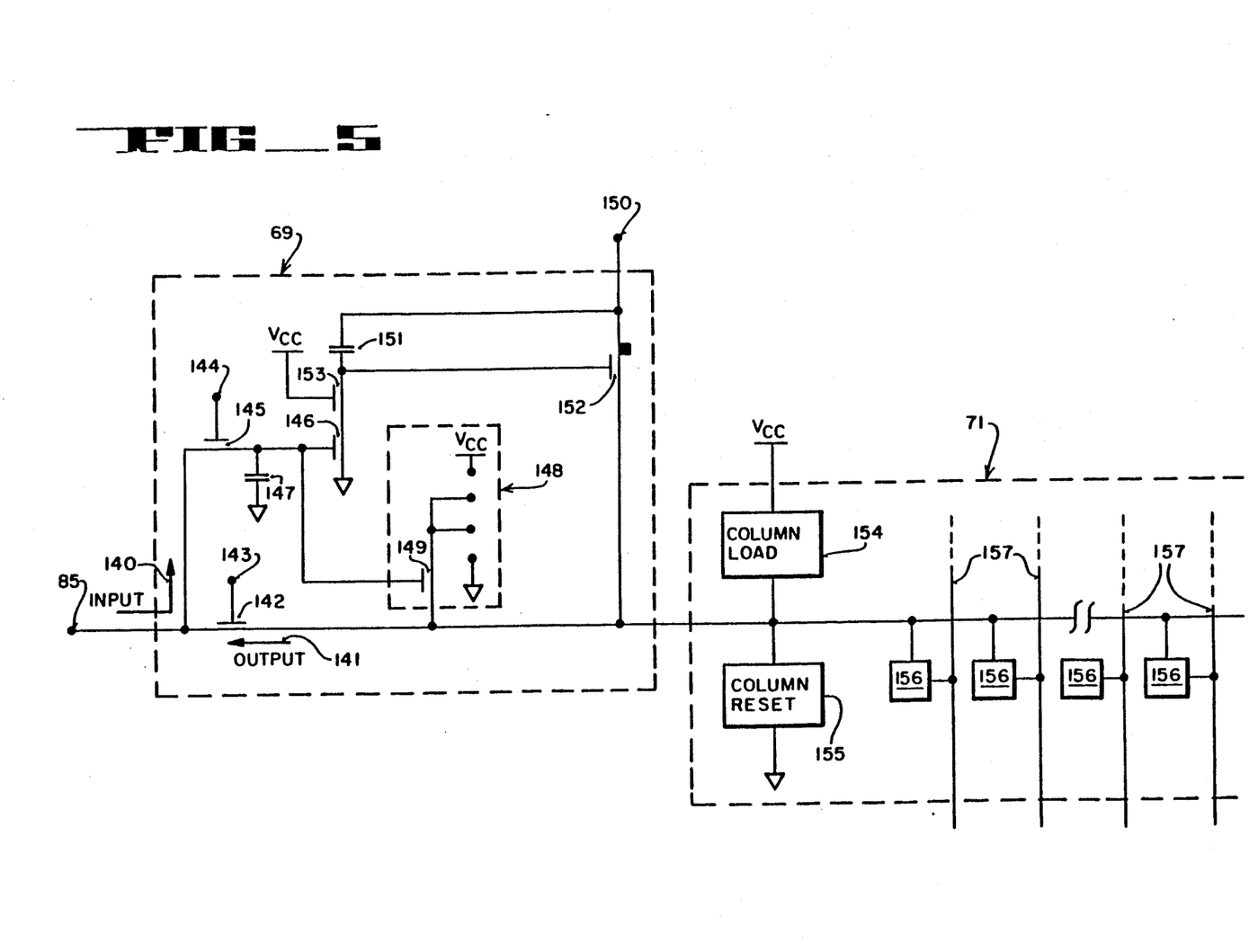
FIG. 5 is a schematic circuit diagram of the remainder of circuitry of FIG. 3 not shown in FIG. 4.

FIG. 5 shows a circuit diagram of the remainder of the read/write column driver of FIG. 3 not shown in FIG. 4. $V_{I/O}$ line 85 is coupled to high voltage column charger 69. Both a digital input path 140 and an analog output path 141 are shown along $V_{I/O}$ line 85. The analog output path 141 starts at the right at column 71, passes through transistor 142 whose gate terminal 143 is coupled to the read signal to $V_{I/O}$ line 85.

Referring to FIG. 4, the signal then passes through column read/write transistor 84 through column access transistor 81 to analog I/O output line 80. Referring to both FIGS. 4 and 5, reading is accomplished by the coordinated activation of the read signal at terminal 143, the column read circuit 84 and column access transistor 81. The digital input path 140 starts at comparator 66, through comparator send circuit 68, through $V_{I/O}$ line 85, to high voltage column charger 69.

Referring now entirely to FIG. 5, the write signal at terminal 144 is coupled to the gate of transistor 145 that controls access to the high voltage charging section of high voltage column charger 69. The gate of transistor 146 is coupled to the end of digital input path 140 through transistor 145. Holding capacitor 147 is coupled between ground and the digital input path 140 between the gate of transistor 146 and the source-drain circuit of transistor 145. Also coupled to digital input path 140 is a selector circuit 148. Transistor 145 is for controlling input signals. When write signal at terminal 144 turns on transistor 145, a digital input signal charges capacitor 147. Capacitor 147 works with transistor 146 either to continue or to discontinue the high voltage charging cycles during the period between write signals at terminal 144. Transistor 149 latches the column to either ground or to the power supply level, depending on the polarity characteristic of the EEPROM cells used. An optional connection is shown to $V_{CC}$ or to ground for selector circuit 148, the choice depending upon the needs of a specific design.

Column 71 is coupled to high voltage column charger 69, and is comprised of column load 154, column reset 155, and memory cells 156. Column load 154 is a load transistor connected as is known in the art. Column reset 155, coupled to ground, is a circuit capable of resetting the memory cells of the column by grounding the column. Each memory cell 156 is coupled to its respective row line 157. The column load 154 is also coupled to a voltage source, to provide voltage for reading from the memory cells 156.

A high voltage source at terminal 150 supplies column 71 with programming voltage pulses for writing. The high voltage source at terminal 150 is coupled to a first side of capacitor 151 and to the drain of transistor 152. The source-drain circuit of transistor 152 is coupled between high voltage source 150 and column 71. The drain of tansistor 153 is coupled to the other side of capacitor 151. The source of transistor 153 is coupled to the drain of transistor 146. Transistor 146's source is coupled to ground. The gate of transistor 153 is coupled to a voltage source $V_{CC}$ so that transistor 153 is permanently conducting. Transistor 152 has a lighter drain doping to increase the breakdown voltge of its drain junction. The function of transistor 153 is to increase the breakdown voltage of the node connected to the gate of transistor 152. Capacitor 151 is used as a bootstrap to charge the gate of transistor 152. On-chip high voltage source 150 must provide a high voltage signal for hundreds of column chargers of the present invention. Because of this constraint, high voltage column chargers 69 must draw very low currents. The design described above uses capacitor 151 to accomplish this.

In high voltage column charger 69, as shown in FIG. 5, some elements are not essential for the present invention. Transistor 153 and the light doping of the drain of transistor 152 are not necessary, but are used to increase the junciton breakdown of the circuit, allowing for a wider range of voltages to be used. Also selector circuit 148 is not necessary because ideally once the comparator outputs a high digital signal, it should continue to output such signal during the rest of the cycle. However, for practical reasons, the circuitry, because of noise, leakage, or other imperfections could produce an anomalous result in the case of a low-high-low series of signals. Such an anomalous series could cause a significant error on the charging of the memory cell. Thus, selector circuit 148 is used to latch $V_{I/O}$ line 85 to prevent this.

Programming or writing into memory cells 156 first involves activating one of the row lines 157 to select the row of memory cells to be programmed. Then a voltage is supplied by high voltage source 150 to the selected column of memory cells, such as illustrated column 71. This sequence identifies a selected one of cells 156. The programming voltage continues to increment higher until comparator 66 signal high voltage column charger 69 to stop. Many hundreds of incrementations may occur. A that point, the selected memory cell is charged to the appropriate analog level and latching circuit 148 insures that the selected cell will not be charged further. When the high voltage column charger 69 is reset in the next phase, another row line 157 will be activated. Thus, all of memory cells 156 are programmed.

For a further description of the writing process, FIG. 3 will be used. The analog signal from input line 60 is first passed to one of the sample/hold phase-1 circuits 62. In a preferred embodiment of the invention, this continues for 320 samples, at which time the signals from line 60 are switched to the other sample/hold phase-2 circuits 63. At the same time, the signals already stored in sample/hold phase-1 circuits 62 are now written to the memory array.

Writing is an iterative, trial and error process because the analog input signal is low voltage, 1-2 volts for example, and the voltage required to charge a floating gate memory cell may be in the 7-17 volt range. The initial trial voltage is incremented by small fractions of a volt up to 400 times by 38 millivolts per increment. The analog column read/write circuitry coordinates an iterative trial and error comparison process whereby the conductitvity of the memory cell is intelligently adjusted in relation to the size of the analog input voltage. For an embodiment of the invention with 320 columns, the data contained in all 320 analog column read/write circuits, only one of which is shown in FIG. 3, are transferred to memory simultaneously, using the same iterative process carried out in parallel.

In more detail, referring to FIG. 4, to write an analog signal to the array, the array cells must first be cleared or erased. This is done by the action of the row decoder, as is known in the art of EEPROM cells. Depending on the polarity characteristic of the cells, the cell will be rendered either non-conductive or highly conductive. After erasing, writing can proceed. The column decoder 61 selects a column to connect to a signal from the input circuits of I/O interface device 28 (shown in FIG. 1). The analog signal is stored in a holding capacitor in one of the sample/hold circuits described earlier. For purposes of this description, the stored signal will be assumed to be in one of the sample/hold phase-1 circuits 62, although the identical procedure occurs if the stored signal is in one of the sample/hold phase-2 circuits 63. When the comparator 66 is ready to charge a new memory cell, the signal in sample/hold phase-1 circuit 62 produces an image in analog transfer circuit 64.

Next a trial high voltage pulse is imposed upon the column by the high voltage column charger. After the initial high voltage pulse, the column signal voltage is coupled to comparator 66 through compartator entry circuit 67. The comparator 66 now compares the column signal to the sampled input signal stored on analog transfer circuit 64. The comparator 66 compares the images of the actual voltages present in the sample/hold circuit with the voltage on the selected cell and determines which has a higher amplitude. At each step the trial voltage is incremented. When the column signal from comparator entry circuit 67 matches or very slightly exceeds the input signal value from analog transfer circuit 64, the comparator 66 outputs a logical low level onto line 105 to the comparator send circuit 68. Send circuit 68 inverts the low voltage level from comparator 66 and send a logical high level signal to high voltage column charger 69 (FIG. 5). Now referring to FIG. 5, this logical high level signal disables further charging of the column even though high voltage pulses continue to be delivered to the individual column charging circuits via node 150.

The write operation is such that the trial chargings of the column will occur until the columns are charged to a level which matches the input sample signal. In a preferred embodiment, the column high voltage pulse will increment from approximately 5 volts to approximately 20 volts in approximately 400 steps. After each step the column signal feedback to the comparator is the result of conduction between the column load 154 and the particular cell to be programmed. As programming continues, the cell conductance changes incrementally. After each trial high voltage pulse, the cell becomes slightly less conductive. At a certain point the comparator will determine that the column level is high enough to match the sample signal. At that time the high voltage charging will cease for that column from that particular phase of the sample/hold and transfer circuits.

When this occurs, capacitor 147 charges and transistors 146 becomes conductive, pulling down the gate voltage of transistor 152, causing transistor 152 to become non-conductive, thereby disabling any further high voltage charge of the column represented by FIGS. 4 and 5. Simultaneously, the same voltge across capacitor 147 renders transistor 149 conductive. Transistor 149 thereby latches the illustrated column to either ground or to a voltage near $V_{CC}$ via selector circuit 148. This provides for a stable logic feedback to the comparator over analog output path 141.

Referring to FIG. 1, during playback or read out of the recorded information, command selector 10 is used to activate the output circuitry. This causes the output circuit of I/O interface device 28 to become active for transmitting the signals stored in the memory array. These signals are measured by the degree of conductance of each of the cells. The clock addressing sequencer 22 is started at the first row and column operates at 8 KHz. The 8 KHz rate is maintained to yield a faithful reproduction of the sound. Analog signal information is extracted directly from the memory columns and is routed to the output circuits of I/O interface device 28.

Referring to FIG. 5, during reading, column 71 sends the sensed cell signal to output line 85. Referring to FIG. 4, column read transistor 84 receives the sensed cell signal and sends it on through transistor 81 to analog I/O line 80. Column decoder 61 controls the transfer of the signal to the output circuitry 28 shown in FIG. 1.

The present invention uses no mechanical parts or magnetic tape. In contrast to prior art digital memory, where column signals are amplified to produce only two discrete levels, the analog memory of this invention outputs the actual analog column signal directly. Thus the intermediary A-to-D and D-to-A converters are eliminated.

The present invention may also be used for multi-level storage. Multi-level storage is a term used to described storing digital information by placing two or more bits in one analog cell. For example a single analog storage cell may store the values of binary 0000 through 1111 if sixteen or more different voltage levels are distinguished from the output signal from the single analog storage cell. Using this technique, portable recording devices can record using analog storage, convert the analog information to digital, then store the digital information. Although the quality of that recording may be less than full digital recording, much more may be recorded in the same number of cells than was possible using prior art digital techniques.

I claim:

1. Apparatus for storing analog information comprising:
    a memory array comprising a plurality of rows and columns of floating gate non-volatile memory cells, for storing an analog signal;
    write circuitry means coupled to said rows and columns and said memory array for selecting a plurality of cells and for storing a series of samples of a predetermined analog signal on their floating gates, said write circuitry including means for iteratively applying a series of write pulses simultaneously to all of said selected plurality of cells, said series of write pulses having a series of predetermined voltages starting from a low voltage and increasing in voltage with time, whereby charging resolution is improved;

read circuitry means coupled to said rows and columns of said memory array for detecting the analog signal level on each individual cell and for outputting said analog signal level; and control means coupled to said read and write circuitry means operating to cycle reading and writing through the cells in said memory array.

2. The memory array as described in claim 1 wherein said non-volatile memory cells are electrically erasable programmable read only memories.

3. The memory array as described in claim 1 wherein said non-volatile memory cells are erasable programmable read only memories.

4. The apparatus for storing analog information as described in claim 1 wherein said non-volatile memory cells store two or more bits of digital information, whereby said digital information may be stored in said cell as multi-level analog information.

5. A memory array for storing analog information comprising:

a plurality of rows and columns of floating gate non-volatile memory cells for storing an analog signal;

column read/write circuitry coupled to the columns of said memory array for reading the analog signals stored in said memory, and for writing the analog signals into the array;

first and second plurality of sample/hold circuits;

first transfer means coupled to the column read/write circuitry for storing a plurality of samples of said analog input signals on one said first and second plurality of sample/hold circuits;

switching means coupled to said transfer means for switching said plurality of samples of said analog input signal from one of said pluralities of sample/hold circuits to the other for storage when the storage capacity of said first plurality of sample/hold circuits is reached; and second transfer means coupled to said column read/write circuitry for transferring said analog input signals stored on said first plurality of sample/hold circuits to said array while analog signals are being stored on said second plurality of sample/hold circuits, said transferring including the intelligent adjustment of the charges on the memory cells of said array.

6. The memory array as described in claim 5 wherein said non-volatile memory cells are electrically erasable programmable read only memories.

7. The memory array as described in claim 5 wherein said non-volatile memory cells are erasable programmable read only memories.

8. The memory array of claim 5 wherein said non-volatile memory cells store two or more bits of digital information, whereby said digital information may be stored in said cells as multi-level analog information.

9. A memory array for storing analog information comprising:

a plurality of rows and columns of floating gate non-volatile memory cells, each adapted for storing an analog signal;

write circuitry means coupled to said rows and columns of said array for selecting each individual cell and for storing a predetermined analog signal on its floating gate, said write circuitry including a means for applying an iterative series of write pulses simultaneously to said plurality of cells to store charge therein;

comparator means for iteratively comparing the relationship of the charge stored in said selected cell to said predetermined analog signal, said comparator means being coupled to said means for applying said iterative series of write pulses, thereby causing the cessation of the application of said write pulses when the stored charge correctly relates to said predetermined analog signal;

read circuitry means coupled to said rows and columns for detecting the level of said predetermined analog signal on each individual cell and for outputting said analog signal level; and control means coupled to said read and write circuitry means operating to cycle reading and writing through the individual cells in said array.

10. The memory array as described in claim 9 wherein said floating gate non-volatile cells are electrically erasable programmable read only memories.

11. The memory array as described in claim 9 wherein said floating gate non-volatile memory cells are erasable programmable read only memories.

12. The memory array of claim 9 wherein said floating gate non-volatile memory cells store two or more bits of digital information, whereby said digital information may be stored in said cells as multi-level analog information.

* * * * *